United States Patent
Lai et al.

(10) Patent No.: US 10,818,548 B1
(45) Date of Patent: Oct. 27, 2020

(54) METHOD AND STRUCTURE FOR COST EFFECTIVE ENHANCED SELF-ALIGNED CONTACTS

(71) Applicant: International Business Machines Corporation, Armonk, NY (US)

(72) Inventors: Kafai Lai, Poughkeepsie, NY (US); Chih-Chao Yang, Glenmont, NY (US); Yongan Xu, Niskayuna, NY (US); Su Chen Fan, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/426,199

(22) Filed: May 30, 2019

(51) Int. Cl.
| | | |
|---|---|---|
| *H01L 21/768* | (2006.01) | |
| *H01L 29/417* | (2006.01) | |
| *H01L 21/3213* | (2006.01) | |
| *H01L 27/088* | (2006.01) | |

(52) U.S. Cl.
CPC .. *H01L 21/76897* (2013.01); *H01L 21/32134* (2013.01); *H01L 21/76805* (2013.01); *H01L 29/41725* (2013.01); *H01L 27/088* (2013.01)

(58) Field of Classification Search
CPC ......... H01L 21/76897; H01L 21/32134; H01L 21/76805; H01L 29/41725; H01L 27/088; H01L 29/66515; H01L 29/66575–66598; H01L 29/41783; H01L 21/823418; H01L 21/823814
See application file for complete search history.

(56) References Cited

U.S. PATENT DOCUMENTS

| | | | |
|---|---|---|---|
| 6,072,221 A | 6/2000 | Hieda | |
| 6,258,678 B1 | 7/2001 | Liaw | |
| 6,808,975 B2 | 10/2004 | Song et al. | |
| 2001/0014530 A1 | 8/2001 | Koido | |
| 2008/0266927 A1* | 10/2008 | Lee | H01L 27/10876 365/63 |
| 2011/0156107 A1* | 6/2011 | Bohr | H01L 23/5226 257/288 |
| 2014/0346575 A1* | 11/2014 | Chen | H01L 29/0692 257/288 |
| 2016/0190322 A1* | 6/2016 | Liu | H01L 29/66795 257/383 |
| 2016/0211251 A1* | 7/2016 | Liaw | H01L 27/0207 |
| 2020/0043858 A1* | 2/2020 | Wu | H01L 29/41725 |

\* cited by examiner

*Primary Examiner* — Shahed Ahmed
(74) *Attorney, Agent, or Firm* — Fleit Intellectual Property Law; Jose Gutman

(57) ABSTRACT

Various semiconductor fabrication methods and structures are disclosed for cost effectively fabricating a self-aligned contact. A source-drain active region is on a substrate and horizontally extends to sidewall spacers of two adjacent gate stacks on the substrate. A conductive material layer including Titanium is formed by selective deposition on the source-drain active area. An interlevel dielectric (ILD) layer is deposited over the source-drain active area and the two gate stacks. Vertical directional etching in the ILD layer forms a vertical trench contacting the conductive material layer. Selective wet etching in the vertical trench selectively etches the conductive material layer and forms a void therein. Deposition of a second conductive material in the vertical trench fills the vertical trench, including the void, and the second conductive material contacts the top surface of the source-drain active area to form a source-drain self-aligned contact.

20 Claims, 13 Drawing Sheets

US 10,818,548 B1

METHOD AND STRUCTURE FOR COST EFFECTIVE ENHANCED SELF-ALIGNED CONTACTS

BACKGROUND

The present invention generally relates to the field of semiconductors, and more particularly relates to a method of fabricating field-effect (FET) transistor semiconductor devices with self-aligned contacts.

Self-aligned contacts (SAC) are often used in semiconductor chip fabrication for complementary metal-oxide-semiconductor (CMOS) technology below 14 nm nodes, due to limited available space for placing, for example, transistor source/drain contacts. To place transistors as close as possible to each other, a source/drain contact of an FET transistor for example, is merged with a source/drain (S/D) contact of another adjacent FET transistor, thereby minimizing the distance between the two adjacent transistors on a substrate. An example semiconductor structure 100 is shown in FIGS. 1-3.

Due to increasingly smaller pitch values for scaling a semiconductor fabrication process, a pitch tolerance of the fabrication process can cause overlay shifts that result in 1) variable location of a vertical trench over the active area 108, 2) variable vertical trench width, and 3) an exposed sidewall spacer (e.g., a nitride sidewall spacer of a gate stack) in the vertical trench. This geometry, as a result of the overlay shift, can significantly increase the resistance of the overall SAC S/D contact, which detrimentally affects the performance of an electronic circuit using the S/D contact of the respective adjacent transistors.

To try to overcome variabilities of a semiconductor fabrication process, as discussed above, according to the example shown in FIGS. 1-3 a bottom portion of the S/D metal contact is formed using a first conductive material 202 over the entire active area 108. Then, the S/D contact trench is formed on top at the desired pitch values, and tolerances, for scaling a semiconductor fabrication process. The S/D contact trench is then filled with a second conductive material 302 to form the overall vertical S/D metal contact. This arrangement can reduce the interface resistance of the junction at the source-drain active area 108. However, this semiconductor process significantly increases the number of fabrication process steps and increases the overall cost.

Therefore, the inventors have discovered that there is a need for a new fabrication method of semiconductor structures that overcomes the above mentioned problems.

SUMMARY OF THE INVENTION

Various embodiments of the present invention include fabrication of a semiconductor structure including at least one self-aligned contact. A method and structure, for example, provides a semiconductor material stack including a plurality of layers, in which a first gate stack and a second gate stack are directly on a substrate. The first gate stack includes a first sidewall spacer and the second gate stack includes a second sidewall spacer. A source-drain epi layer is directly on and contacting a top surface of the substrate and horizontally extends to, and contacts, the first sidewall spacer and the second sidewall spacer. A top surface of the source-drain epi layer provides a source-drain active area of at least one semiconductor device. According to the example method, a conductive material layer is formed, by selective deposition of a first conductive material including Titanium or Titanium Nitride, directly on and contacting a top surface of the source-drain active area. A first dielectric material is deposited directly on and contacting a top surface of the conductive material layer, the first sidewall spacer, and the second sidewall spacer, to form an interlevel dielectric (ILD) layer. The method then performs vertical directional etching in the ILD layer to form a vertical trench extending vertically from a top opening thereof to a bottom opening thereof that is contacting the top surface of the conductive material layer on the source-drain active area. Selective wet etching in the vertical trench is then performed to selectively etch the first conductive material of the conductive material layer, the wet etch being selective to the first conductive material over the first dielectric material of the ILD layer. The selective wet etch forms a void in the conductive material layer and exposes in the vertical trench a top surface of the source-drain active area. The void extends horizontally outwards and enlarges the bottom opening of the vertical trench making it horizontally larger than the top opening. Deposition of a second conductive material is then performed filling the vertical trench from the top opening thereof to the bottom opening thereof with the second conductive material contacting the top surface of the source-drain active area to form a source-drain self-aligned contact.

According to various embodiments, a semiconductor structure comprises a semiconductor material stack including a plurality of layers and a substrate. A first gate stack is directly on the substrate. The first gate stack includes at least a first sidewall spacer. A second gate stack is directly on the substrate. The second gate stack includes a second sidewall spacer. A source-drain epi layer is directly on and contacting a top surface of the substrate. The source-drain epi layer horizontally extends to, and contacts, the first sidewall spacer and the second sidewall spacer. A top surface of the source-drain epi layer provides a source-drain active area of at least one semiconductor device. An interlevel dielectric (ILD) layer is located above the first gate stack, the second gate stack, and the source-drain active area. A self-aligned contact comprises conductive material fill in a vertical trench in the ILD layer and extending from a top opening of the vertical trench to a bottom opening thereof. The bottom opening of the vertical trench is horizontally larger than the top opening of the vertical trench. The conductive material in the vertical trench fill contacts the top surface of the source-drain active area to form a source-drain self-aligned contact.

In various embodiments, the top opening of the vertical trench in the ILD layer above the source-drain active area is located entirely to one side of a vertical axis located at a center region along a horizontal critical dimension measured from an outer wall surface of the first sidewall spacer to an outer wall surface of the second sidewall spacer, the vertical trench being filled with the conductive material fill to form the source-drain self-aligned contact. The conductive material fill in the vertical trench has a cross-section from the top opening of the vertical trench to the bottom opening of the vertical trench that is substantially in an "L" shape.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

Figure 1:
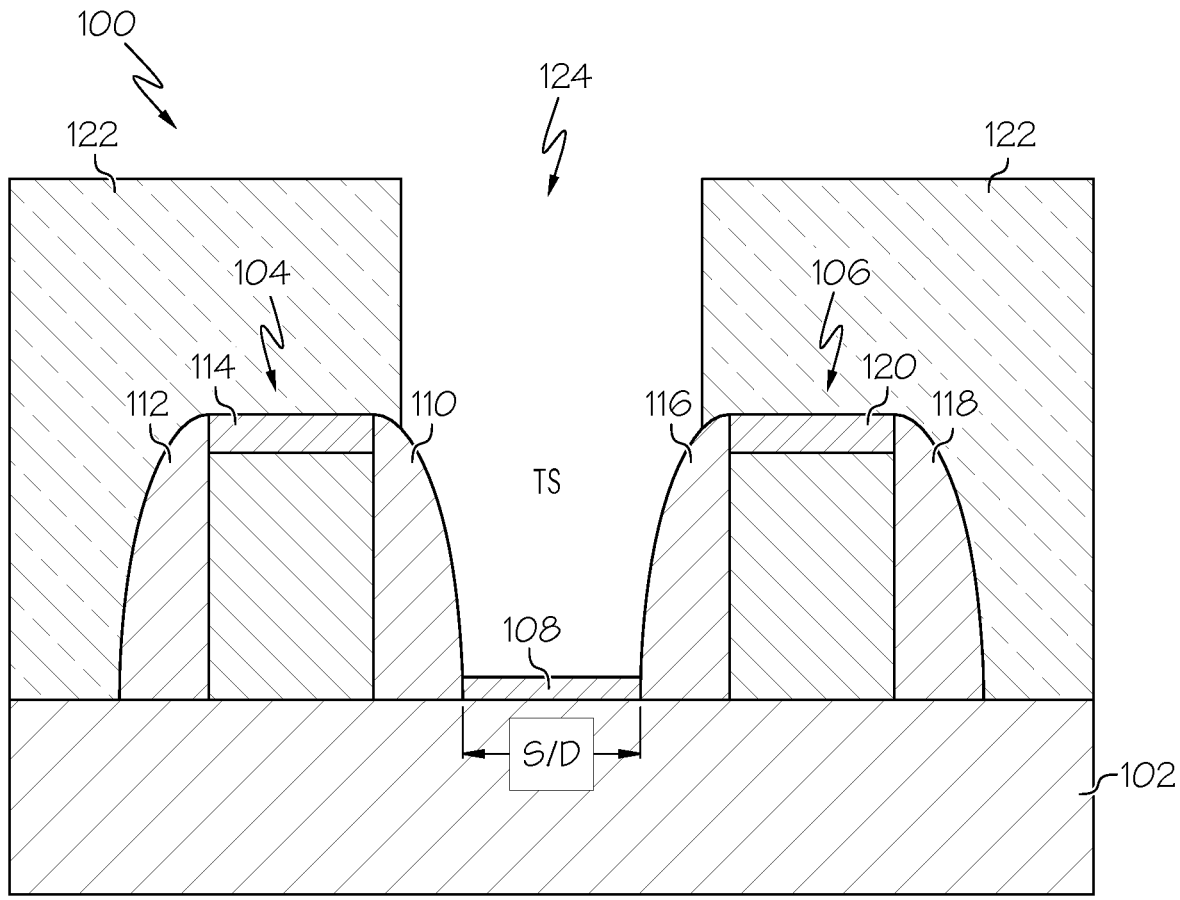
FIG. 1 is a cross-sectional side view of an example semiconductor structure at a first point in a prior art fabrication process.

It is to be understood that the present invention will be described in terms of illustrative example fabrication processes for fabricating field-effect transistor semiconductor devices. However, other semiconductor architectures, structures, substrate materials, and process features and steps may be varied within the scope of the present invention. Various embodiments of the present invention include a plurality of self-aligned contacts (SAC) on the same semiconductor substrate on a wafer. This structure may be used, for example, to create CMOS devices in an integrated circuit.

It will also be understood that when an element such as a layer, region or substrate is referred to as being "on" or "over" another element, it can be directly on the other element or intervening elements may also be present. Similar but inverse meaning will be understood for an element such as a layer, region, or substrate that is referred to as being "under" or "below" another element. It can be directly under the other element or intervening elements may also be present. In contrast, when an element is referred to as being "directly on" or "directly over", or alternatively referred to as being "directly under" or "directly below" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used as part of a process in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be understood that the various layers and/or regions shown in the accompanying drawings are not drawn to scale, and that one or more layers and/or regions of a type commonly used in complementary metal-oxide semiconductor (CMOS), field-effect transistor (FET), metal-oxide-semiconductor field-effect transistor (MOSFET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with various embodiments of the present invention can be employed in applications, hardware, and/or electronic systems. Suitable electronic hardware and systems for implementing embodiments of the invention may include, but are not limited to, personal computers, communication networks, electronic commerce systems, portable communications devices (e.g., cellular and smart phones), solid-state media storage devices, functional circuitry, etc. Systems and hardware incorporating the semiconductor devices and structures are contemplated embodiments of the invention. Given the teachings of example embodiments of the invention provided herein, one of ordinary skill in the art will be able to contemplate other implementations and applications of embodiments of the invention.

Various embodiments of the present invention can be implemented in connection with semiconductor devices, and related semiconductor fabrication processes, that may use CMOSs, MOSFETs and/or FETs technology. By way of non-limiting example, the semiconductor devices can include, but are not limited to CMOS, MOSFET, and FET devices, and/or semiconductor devices that use CMOS, MOSFET and/or FET technology.

As used herein, "vertical" refers to a direction perpendicular to a substrate in any cross-sectional and three-dimensional views herein. Current between source/drain regions can be described herein as flowing in a vertical direction (e.g., between a bottom point in a vertical self-aligned contact directly contacting a source-drain epi-layer and a top point in the vertical self-aligned contact that is above the bottom point). As used herein, "horizontal" refers to a direction parallel to a substrate in any cross-sectional and three-dimensional views herein.

As used herein, "thickness", "thick", or the like, refers to a size of an element (e.g., a layer, trench, hole, etc.) in a cross-sectional view measured from a bottom surface to a top surface, or from a left side surface to a right side surface of the element, and/or measured with respect to a surface directly adjacent to and contacting the element (e.g., a surface on which the element is directly disposed on).

Additionally, the terms "width" or "width value", and the like, refer to a distance from a start point on a structure to an end point on the same structure, in a critical dimension. For example, with reference to FIG. 3, a width value could be horizontally measured along a critical dimension from a start point of the contact 302 structure to an end point on the same contact 302 structure.

Unless otherwise specified, as used herein, "height" or "height above a substrate" refers to a vertical size of an element (e.g., a layer, trench, hole, etc.) in a cross-sectional view measured from a top surface of the substrate to a top surface of the element. A thickness of an element can be equal to a height of the element if the element is directly on the substrate.

As used herein, the terms "lateral," "lateral side," "lateral surface" refer to a side surface of an element (e.g., a layer, opening, a sidewall spacer, etc.), such as a left or right side surface in a cross-sectional view herein.

As used herein, the terms "pitch" or "pitch value", and the like, refer to a distance from a point on a first semiconductor structure to a corresponding point on a second semiconductor, in a pattern of semiconductor structures disposed on a substrate. The points of reference may be located at a start point, at a center point, or at an endpoint, of a semiconductor structure and a corresponding adjacent semiconductor structure. For example, generally with reference to FIG. 3, a pitch value can be measured along a horizontal critical dimension from a start point of a first structure, e.g., the copper contact 302, to a start point of an adjacent second structure, e.g., the cap 120 of the second gate stack 106. Pitch value measurements, for example, could be taken along a horizontal critical dimension in a pattern of first, second, third, and fourth structures, measured between the first and second structures, between the second and a third structures, between the third and a fourth structures, and so forth.

The terms "pitch walk", "pitch variability", "pitch tolerances", and the like, synonymously mean herein the same type of semiconductor structure metrology to determine pitch values of adjacent semiconductor structures in a pattern disposed on a substrate. These patterns of adjacent semiconductor structures may be used, for example, to fabricate one or more of: FET semiconductor devices, transistor semiconductor devices, vertical metallization structures in metallization layers such as back-end-of-line (BEOL) metallization layers, and the like.

The terms viabar or super-viabar may be used interchangeably in this disclosure, and are intended to mean an electrical interconnect structure that vertically interconnects a vertically mismatched metallization contact in, for example, a BEOL metallization layer with a semiconductor contact on a surface of a layer of a semiconductor stack below (or above) the vertically mismatched metallization contact. A viabar structure, as used herein, is defined as a generally rectangular electrical wire structure (that may be also referred to as an electrical interconnect or an electrical junction) typically extending horizontally across one metallization layer in a semiconductor structure and extending vertically across two or more layers in a material stack in the semiconductor structure. A super viabar structure, as used herein, means a viabar structure extending horizontally across a metallization layer that is disposed on top of two or more layers in a material stack in a semiconductor structure in which the super viabar structure is extending vertically across the two or more layers in the material stack in the semiconductor structure. The super viabar structure provides an electrical interconnect or an electrical junction between features in the two or more layers in the material stack in the semiconductor structure.

Figure 2:
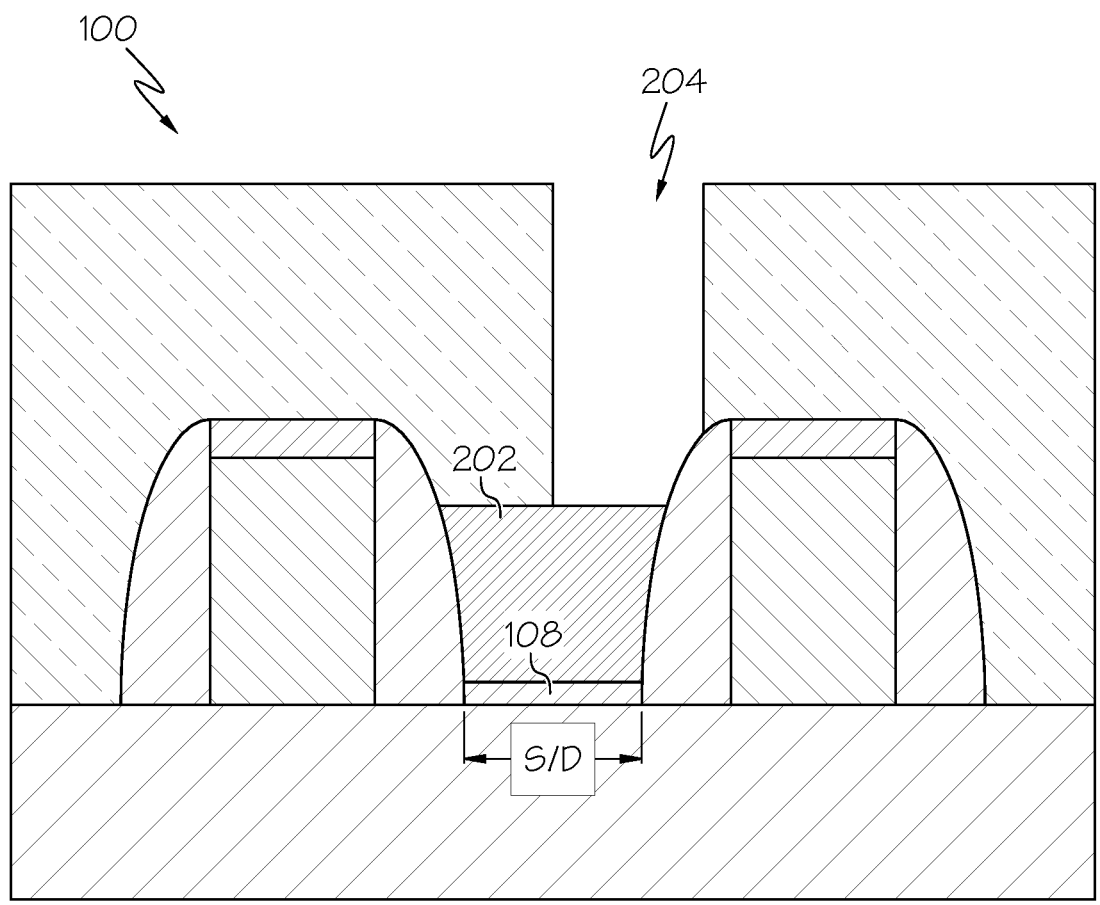
FIG. 2 is a cross-sectional side view of the example semiconductor structure of FIG. 1 at a second point in the prior art fabrication process.
Figure 3:
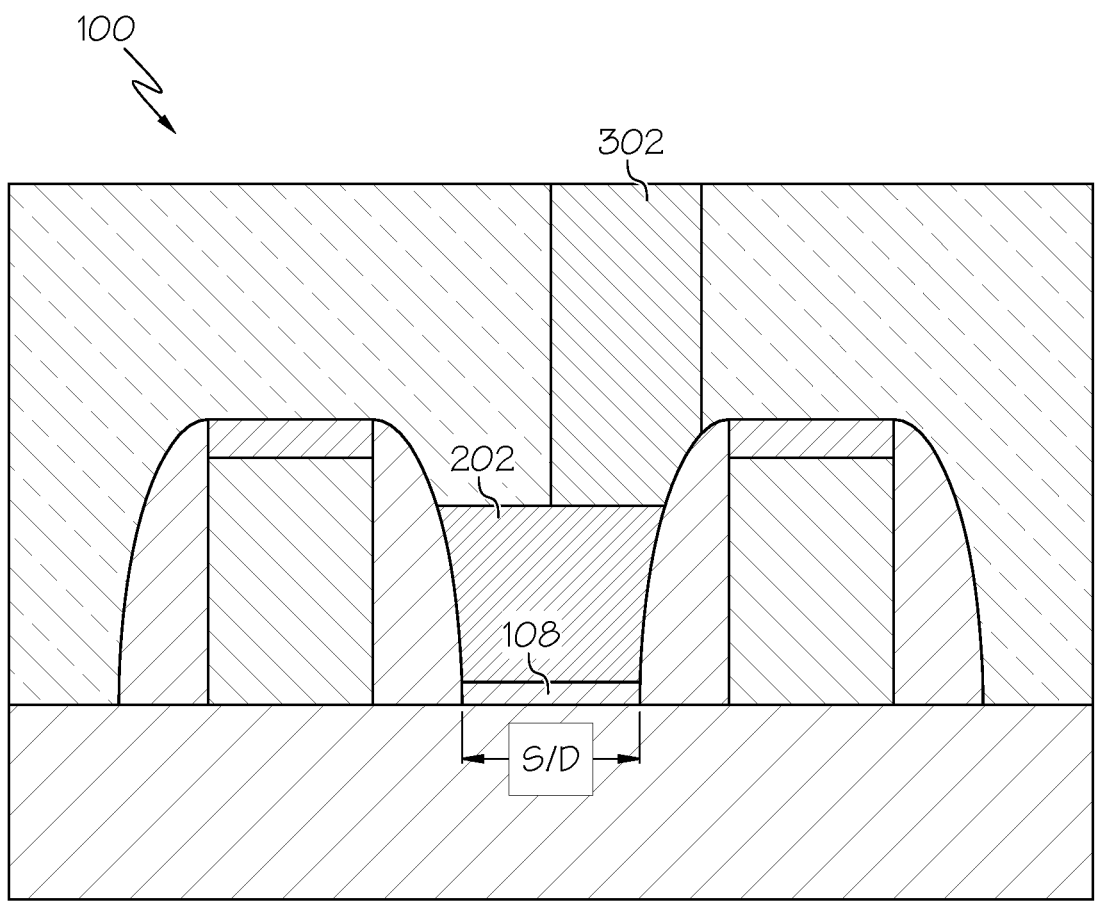
FIG. 3 is a cross-sectional side view of the example semiconductor structure of FIG. 1 at a third point in the prior art fabrication process.

Self-aligned contacts (SAC) are often used in semiconductor chip fabrication for complementary metal-oxide-semiconductor (CMOS) technology below 14 nm nodes, due to limited available space for placing, for example, transistor source/drain contacts. To place transistors as close as possible to each other, a source/drain contact of an FET transistor for example, is merged with a source/drain (S/D) contact of another adjacent FET transistor, thereby forming a self-aligned contact (SAC). The merged source/drain contact will be located very close to an adjacent gate stack of each of the two adjacent transistors. A spacer insulating material (e.g., a nitride material) typically separates the conductive source/drain contact from the adjacent gate stack of each of the two adjacent transistors. The example semiconductor structure 100 shown in FIGS. 1-3 illustrates a typical semiconductor fabrication process. A SAC source/drain contact between adjacent gate stacks 104, 106, is separated by insulating dielectric material of two sidewall spacers 110, 116 of the respective two gate stacks 104, 106.

A metal S/D contact is typically formed on, and contacts, a top surface of an S/D active area 108 on the substrate 102. Due to increasingly smaller pitch values for scaling a semiconductor fabrication process, a pitch tolerance of the fabrication process can cause overlay shifts that result in 1) variable location of a vertical trench over the active area 108, 2) variable vertical trench width, and 3) an exposed sidewall spacer (e.g., a nitride sidewall spacer of a gate stack) in the vertical trench. This variability of trench formation often detrimentally affects the metal contact geometry, and increases S/D contact resistance due to the S/D metal contact contacting the active area 108 over a small area. That is, the vertical SAC metal contacts a top surface area of the active area 108 that is significantly smaller than the entire active area 108. This geometry, as a result of the overlay shift, can significantly increase the resistance of the overall SAC S/D contact, which detrimentally affects the performance of an electronic circuit using the S/D contact of the respective adjacent transistors.

To try to overcome variabilities of a semiconductor fabrication process, as discussed above, according to the example shown in FIGS. 1-3 a bottom portion of the S/D metal contact is formed using a first conductive material 202 over the entire active area 108. Then, the S/D contact trench is formed on top at the desired pitch values, and tolerances, for scaling a semiconductor fabrication process. The S/D contact trench is then filled with a second conductive material 302 to form the overall vertical S/D metal contact.

Specifically, according to one example process, the first gate stack 104 is formed on the substrate 102. The first gate stack 104 includes sidewall spacers 110, 112, and a cap 114. A second gate stack 106 is formed on the substrate 102. The second gate stack 106 includes sidewall spacers 116, 118, and a cap 120. In certain embodiments, the gate stacks 104, 106, may comprise dummy gate structures as part of a fabrication process.

An interlevel dielectric (ILD) layer 122 is deposited over the gate stacks 104, 106, and the active area 108 on the substrate 102. The ILD layer 122 is etched so as to define a first vertical trench 124 that extends from a top opening of the first vertical trench 124 down to a bottom opening thereof directly over and contacting a top surface of the active area 108 on the substrate 102. The first vertical trench 124, from top opening to bottom opening, extends horizontally across the entire contact active area 108 between the two sidewall spacers 110, 116, of the two gate stacks 104, 106, as shown in FIG. 1. Trench silicide (TS) is formed in the active area 108 by epitaxy on the top surface of the active area 108 on the substrate 102, thereby epitaxially growing a layer (also referred to as an "epi" layer 108) in the self-aligned source-drain contact active area 108 between the two sidewall spacers 110, 116, of the two gate stacks 104, 105.

Next, according to the example, the first conductive material 202 is filled into the top opening of the vertical trench 124 filling with the first conductive material 202 up to generally a mid-point of the gate stack sidewall spacers 110, 116, as shown in FIG. 2. The first conductive material 202 contacts the top surface of the SAC source-drain active area 108. ILD layer material 122 (e.g., oxide) is then deposited over the semiconductor structure 100 and planarized.

Continuing with FIG. 2, the ILD layer 122 is etched (e.g., by a second vertical directional etching) so as to define a second vertical contact trench 204 that extends from a top opening of the second vertical contact trench 204 down to a bottom opening thereof directly over and contacting a top surface of the first conductive material 202. The top and bottom openings of the second vertical contact trench 204 can be much smaller than the top and bottom openings of the first vertical trench 124. However, due to smaller and smaller pitch tolerances, the location, and width, of the second vertical contact trench 204 can vary between the two gate stacks 104, 106.

As shown in FIG. 3, the second conductive material 302, e.g., copper metal fill (Cu), is deposited in and fills the second vertical contact trench 204, followed by planarization. The contact metal second material layer 302, e.g., made of copper (Cu), provides a self-aligned metal contact for an upper layer circuit (not shown). The contact metal second material layer 302 couples electrical signals, through the first conductive material layer 202, with the source-drain active area 108. The first conductive material layer 202 provides a large metal target surface which facilitates the self-aligned metal contact 302 to make electrical contact, through the first conductive material layer 202, with substantially all the top surface of the source-drain active area 108, even while the location and width of the second vertical contact trench 204 can vary between the two gate stacks 104, 106. This arrangement reduces the interface resistance, and enhances the signal performance, of the junction at the source-drain active area 108. However, this semiconductor process significantly increases the number of fabrication process steps and increases the overall cost.

This disclosure will continue below describing an inventive semiconductor fabrication process, with reference to the drawing FIGS. 4 to 13, that overcomes the problems discussed above. In these figures, like reference numbers represent the same or similar elements. Further, a detailed explanation of the same or similar features, elements, or structures will not be repeated for each of the drawings.

Figure 4:
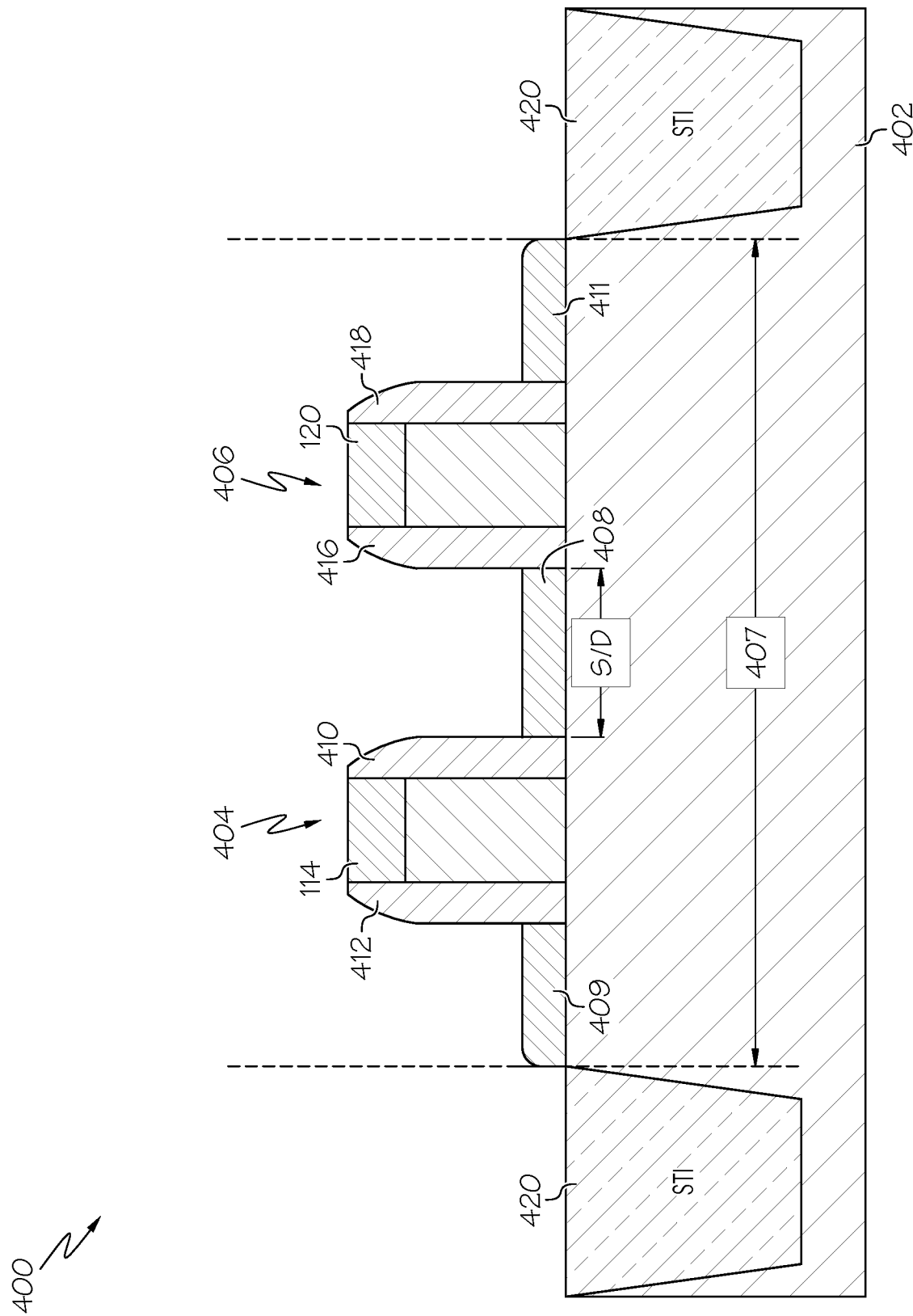
FIG. 4 is a cross-sectional side view of a semiconductor structure at a point in an example fabrication process following patterning and etching of a material stack, such as for fabricating FET semiconductor devices, according to an embodiment of the present invention.

FIG. 4 shows an example of a semiconductor structure 400 comprising a material stack 402, 404, 406, 408, 409, 411, 420, suitable for fabrication of a plurality of FET semiconductor devices. At the bottom of the material stack is a substrate layer (may also be referred to as a substrate) 402. The substrate 402, according to the example, comprises silicon. However, other semiconductor materials may be used according to various embodiments of the present invention. The substrate 402, for example and not for limitation, according to various embodiments may comprise at least one material selected from the following: silicon (Si), silicon germanium (SiGe), silicon carbide (SiC), Si:C (carbon doped silicon), silicon germanium carbide (SiGeC), carbon doped silicon germanium (SiGe:C), III-V compound semiconductor, or II-V compound semiconductor, an organic semiconductor, a layered semiconductor, a silicon-on-insulator, a SiGe-on-insulator, amorphous material, polycrystalline material, monocrystalline material, or a hybrid oriented (HOT) semiconductor material, or a combination of the materials in this set.

According to a semiconductor fabrication process, disposed directly on the top surface of the substrate 402 are first and second gate stacks 404, 406. An epitaxially grown layer, as indicated by the three segments, 408, 409, 411, shown in FIG. 4, extends to an entire active region 407 between two shallow trench isolation (STI) layers 420 on the substrate 402. A merged source/drain active region 408, of two adjacent FETs, is indicated by the middle segment 408 of the epitaxially grown layer. This merged source/drain active region 408 forms a shared node of the two adjacent FET transistors, and which can in various examples be a shared node of a plurality of FETs and optionally be a shared node of a plurality of finFETs, and the like.

The merged source/drain active region 408 may also be referred to as the source/drain epitaxy region layer 408, which may also be referred to as the "epitaxially grown source/drain region", "source/drain epitaxy region", "source/drain contact region", "source/drain active region", "source/drain region layer", "source/drain epi region layer", "epitaxy region", "epi region" or "epi region layer", or "source/drain region", or the like. This merged source/drain active region 408 extends between the two gate stacks 404, 406. The top surface of the source/drain epitaxy region layer 408 may also be referred to as the "epitaxially grown source/drain area", "source/drain epitaxy area", "source/drain contact area", "source/drain active area", "source/drain area", "epitaxy area", "epi area", or "source/drain area", or the like. The merged source/drain active area 408 extends between the two gate stacks 404, 406.

The first gate stack 404 is directly on the top surface of the substrate 402. The first gate stack 404 includes a first sidewall spacer 410 and a second sidewall spacer 412. The second gate stack 406 is directly on the top surface of the substrate 402. The second gate stack 406 includes a first sidewall spacer 418 and a second sidewall spacer 416. At least one of the first sidewall spacer or the second sidewall spacer can include at least one dielectric material selected from the following set of dielectric materials consisting of: Silicon Nitride (SiN), Silicon Oxynitride (SiON), Silicon Boron Carbon Nitride (SiBCN), or Silicon Oxygen Carbon Nitride (SiOCN).

The source-drain epi layer 408 is directly on and contacting a top surface of the substrate. The source-drain epi layer 408 horizontally extends to, and contacts, the first sidewall spacer 410 of the first gate stack 404 and the second sidewall spacer 416 of the second gate stack 406. A top surface of the source-drain epi layer 408 provides a source-drain active area of at least one semiconductor device.

Figure 5:
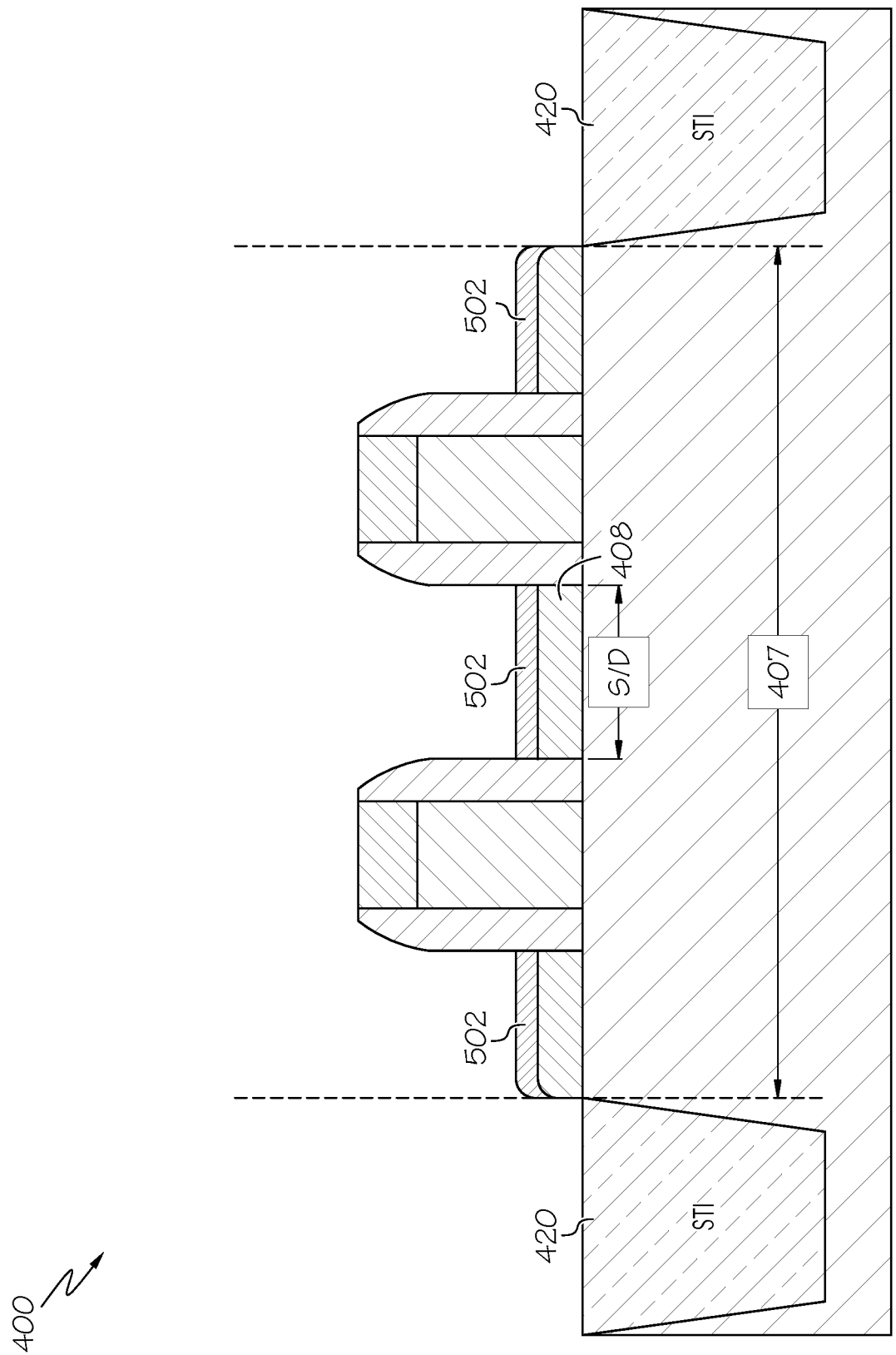
FIG. 5 is a cross-sectional side view of the semiconductor structure of FIG. 4 at a subsequent point in the example fabrication process, after selective deposition of a first conductive material of a conductive material layer directly on and contacting a top surface of a source-drain active area.

Referring now to FIG. 5, a conductive material layer 502 is formed, by selective deposition of a first conductive material including Titanium or Titanium Nitride, directly on and contacting a top surface of the source-drain active area 408. As can be seen in FIG. 5, the conductive material layer 502 can also be formed directly on a top surface of the other two segments 409, 411, of the epitaxially grown layer 408, 409, 411. However, the present discussion, for simplicity, is mainly directed to the deposition of the conductive material layer 502, including Titanium or Titanium Nitride, which is selectively deposited directly on and contacting a top surface of the source-drain active area 408. According to the present example, the conductive material layer 502 is selectively deposited directly on and contacting the entire top surface of the source-drain active area 408. This can be done using a selective atomic layer deposition (ALD) process that deposits a thin coat material only on the top surface of the source-drain active area 408. The conductive material layer 502, according to the example, is made of material comprising Titanium or Titanium Nitride, or another conductive material compound including Titanium.

Figure 6:
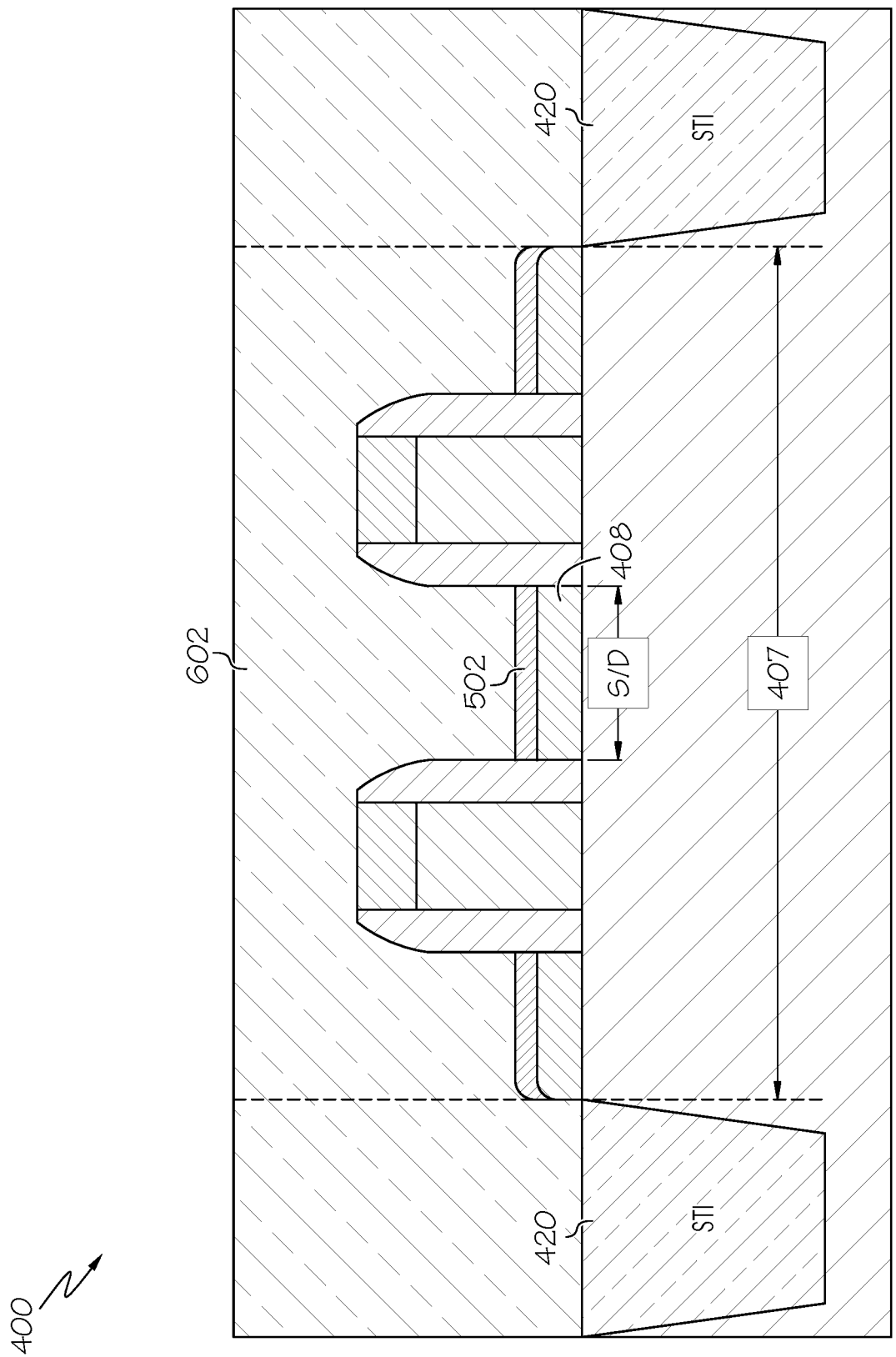
FIG. 6 is a cross-sectional side view of the semiconductor structure of FIG. 5 at a subsequent point in the example fabrication process, following deposition of dielectric material to form an interlevel dielectric (ILL)) layer.

As shown in FIG. 6, the fabrication process continues by depositing a dielectric material to form an interlevel dielectric (ILD) layer 602 directly on and contacting a top surface of the conductive material layer 502, the first gate stack 404, and the second gate stack 406. Deposition of the ILD layer 602 can be by using a chemical vapor deposition (CVD), or a physical vapor deposition (PVD), process followed by a planarization process such as by a chemical and mechanical polishing (CMP) step or an etching step to bring the level of the ILD layer 602 down to a desired level. The ILD layer 602 can include at least one dielectric material selected from the following set of dielectric materials consisting of: Silicon Oxide (SiO), Silicon Dioxide ($SiO_2$), or Carbon Doped Silicon Oxide (SiCOH). The ILD layer 602 will be formed directly on and contacting a top surface of the conductive material layer 502 and, according to various embodiments, on at least one of the first sidewall spacer 410 of the first gate stack 404 or the second sidewall spacer 416 of the second gate stack 406.

Figure 7:
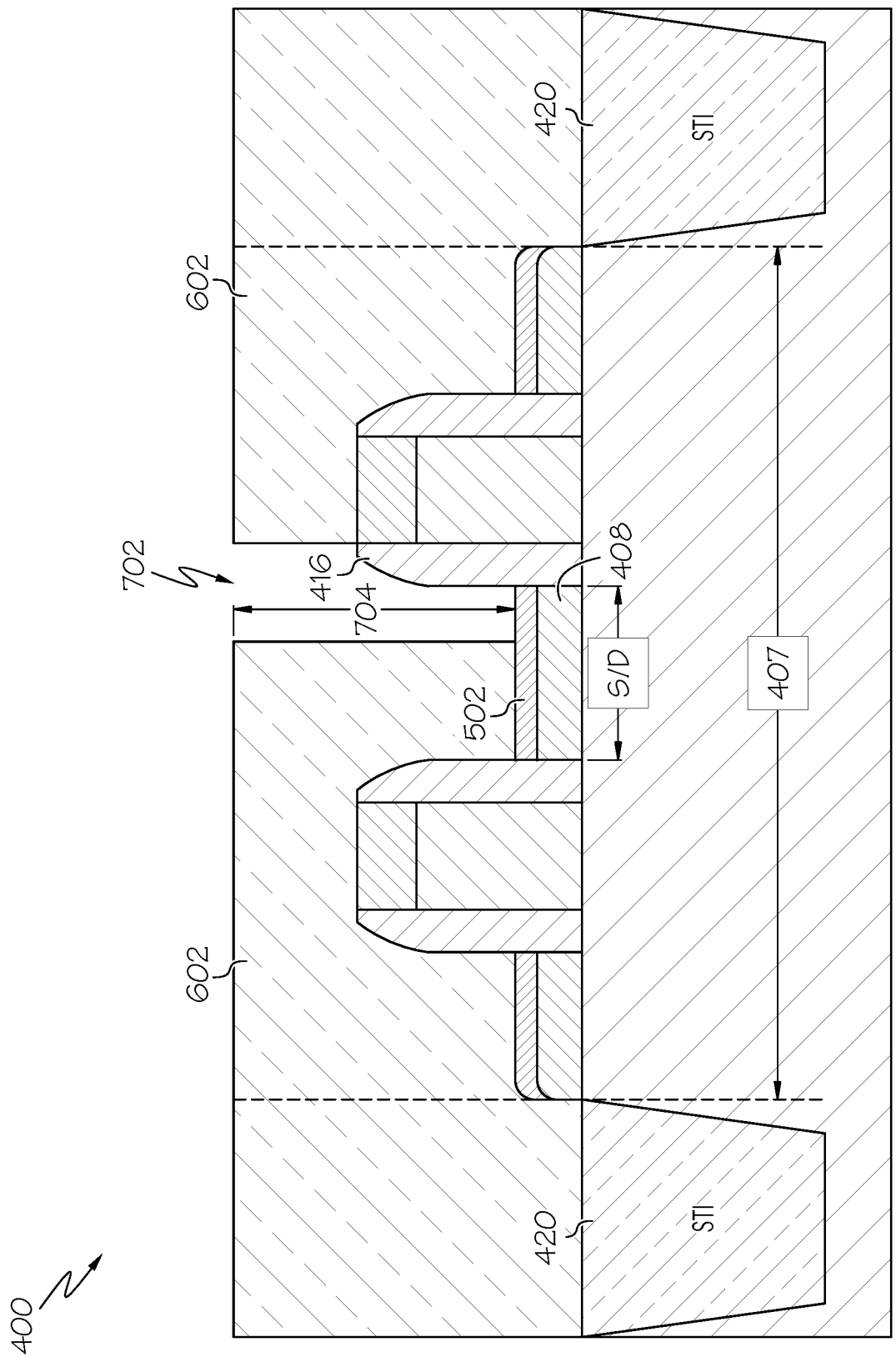
FIG. 7 is a cross-sectional side view of the semiconductor structure of FIG. 6 at a subsequent point in the example fabrication process, following vertical directional etching in the ILD layer to form a vertical trench.
Figure 10:
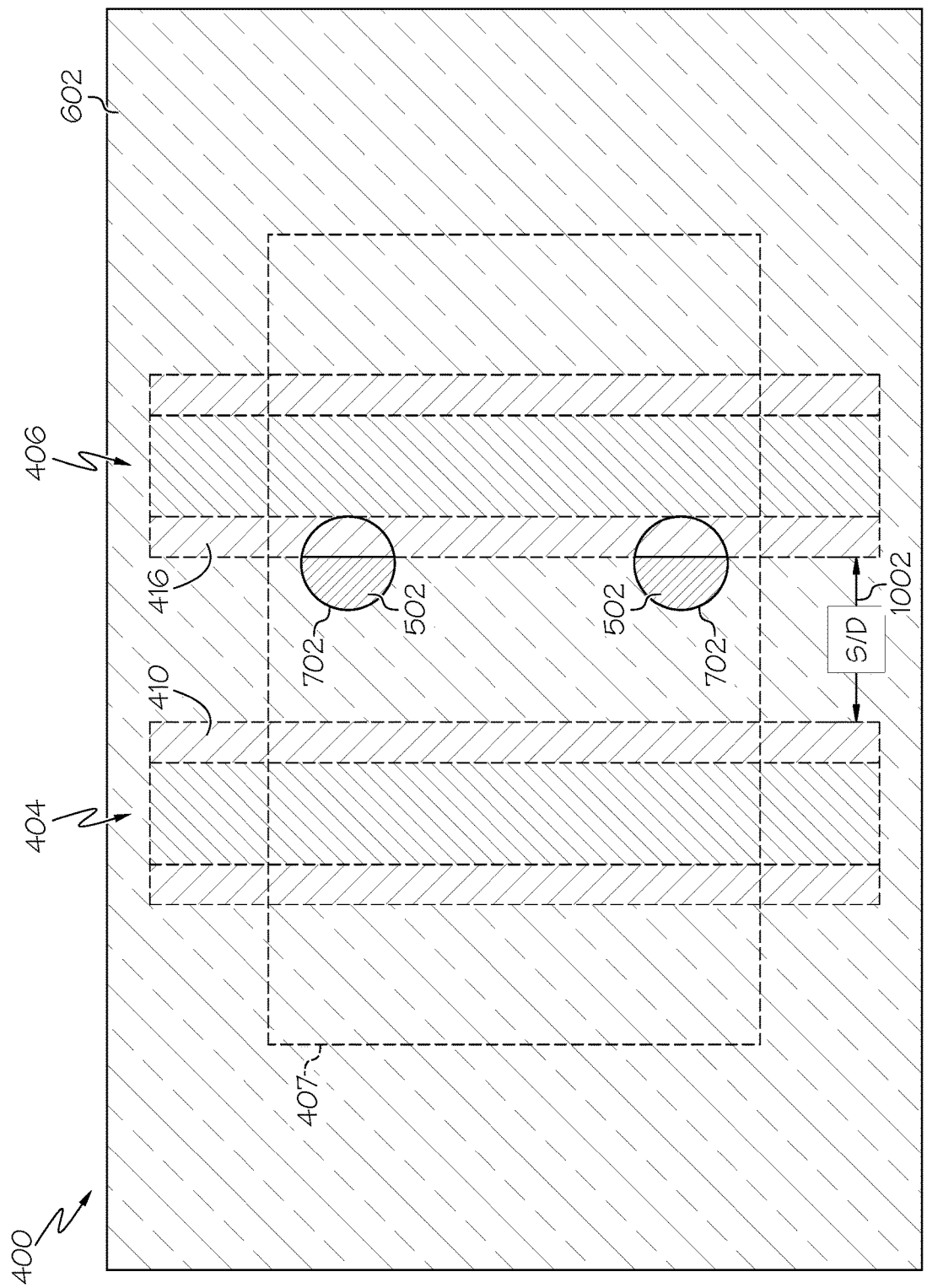
FIG. 10 is a top planar view of the semiconductor structure of FIG. 7.

Referring to FIGS. 7 and 10, the semiconductor fabrication process continues by performing vertical directional etching in the ILD layer 602 to form a vertical trench 702. An example of a vertical directional etching process that etches into the ILD layer 602 is reactive ion etching (RIE) using a fluoride based chemistry. This is also referred to as a "dry etch" or "isotropic dry etch" using a fluoride based chemistry. The vertical trench 702 extends vertically 704 from a top opening thereof to a bottom opening thereof that is contacting the top surface of the conductive material layer 502 on the source-drain active area 408. FIG. 10 shows a top view corresponding to the cross-sectional view of FIG. 7. The vertical trench 702 in the ILD layer 602, according to the present example, exposes the conductive material layer 502 and the second sidewall spacer 416 of the second gate stack 406.

Figure 8:
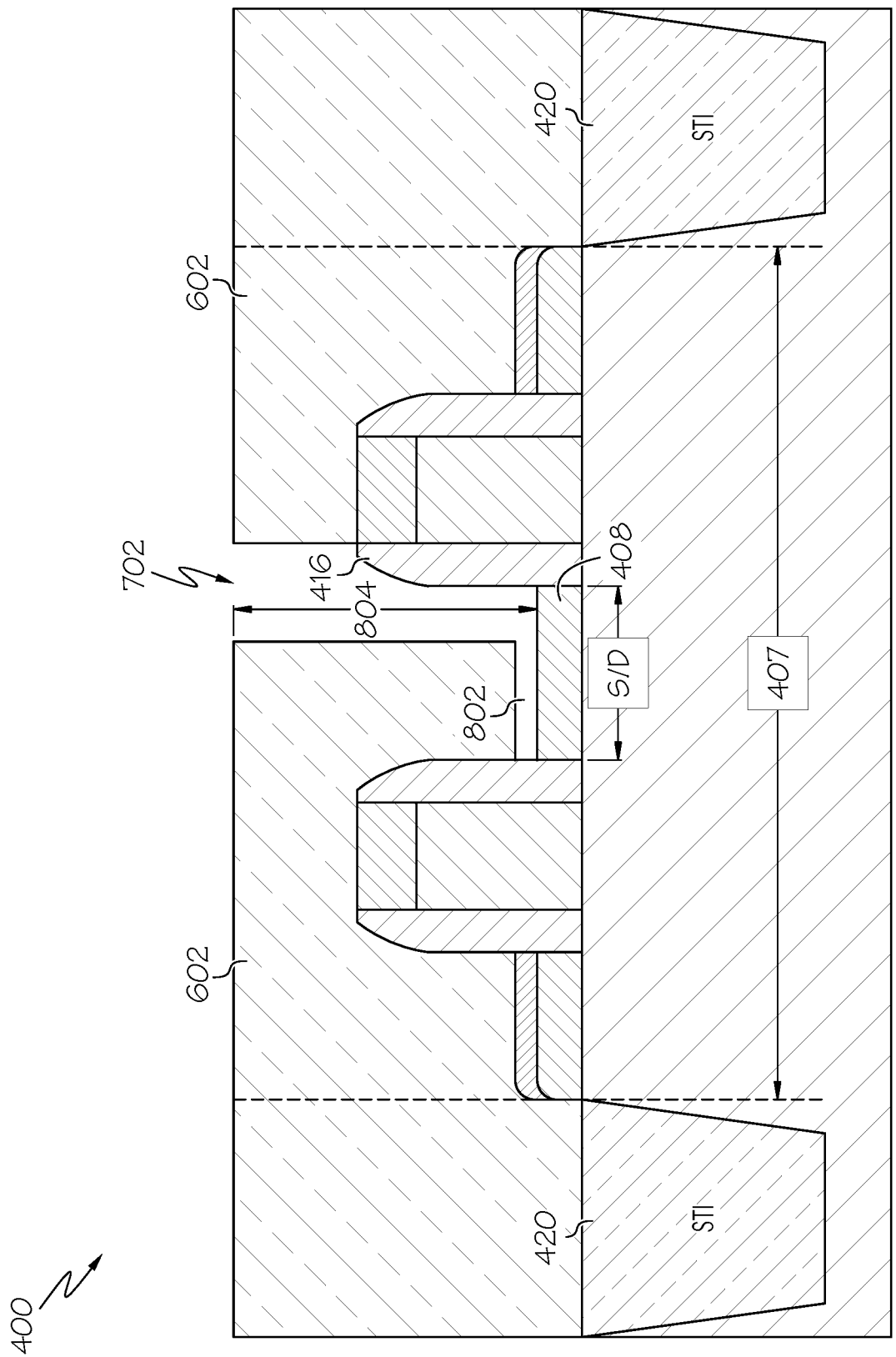
FIG. 8 is a cross-sectional side view of the semiconductor structure of FIG. 7 at a subsequent point in the example fabrication process, following performing selective wet etch in the vertical trench to selectively etch the first conductive material of the conductive material layer and forming a void therein.
Figure 11:
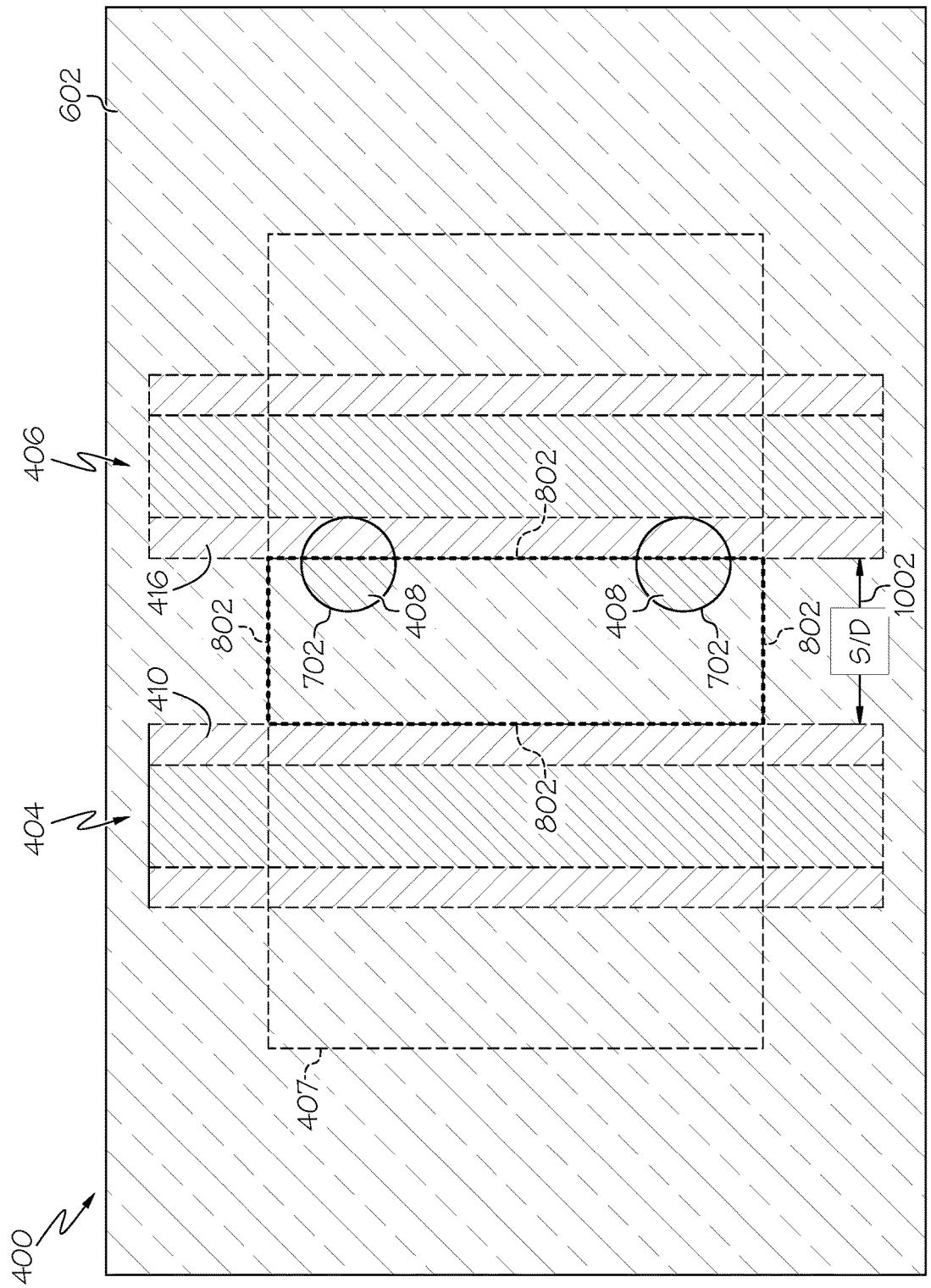
FIG. 11 is a top planar view of the semiconductor structure of FIG. 8.

Continuing with the semiconductor fabrication process, as shown in FIGS. 8 and 11, selective wet etching is performed in the vertical trench 702 to selectively etch the first conductive material of the conductive material layer 502. This is also referred to as "anisotropic wet etch". The selective wet etch is selective to etch the first conductive material of the conductive material layer 502 over the dielectric material of the ILD layer 602. The selective wet etch is also selective to etch the first conductive material of the conductive material layer 502 over the dielectric material of the second sidewall spacer 416 of the second gate stack 406. The selective wet etch in the vertical trench 702 forms a void 802 in the conductive material layer 502 and exposes in the vertical trench 702 a top surface of the source-drain active area 408, which deepens 804 the vertical trench 702. The void 802 also extends horizontally outwards in the conductive material layer 502 which enlarges the bottom opening of the vertical trench 702 horizontally larger than the top opening of the vertical trench 702, as shown in FIG. 8. The selective wet etching in the vertical trench 702 will be generally an omnidirectional etching into the conductive material layer 502 which can form a void 802 that substantially replaces the entire conductive material layer 502.

A second vertical trench 702, as illustrated in FIG. 11, can be contemporaneously etched into the ILD 602, according to various embodiments. The formation of a plurality of vertical trenches 702 is optional, and not necessary. For example, three or more vertical trenches 702 could optionally be formed in the ILD 602 over the conductive material layer 502. The omnidirectional etching into the conductive material layer 502 from the two or more vertical trenches 702, as shown in FIG. 11, can accelerate the formation of the void 802 into the conductive material layer 502. This, of course, can accelerate substantially replacing the entire conductive material layer 502 with the void 802, according to various embodiments.

It should be noted that each of the plurality of vertical trenches 702 will be deepened 804, by the selective wet etching into the conductive material layer 502, and will extend 804 down to, and expose in the respective each vertical trench 702 of the plurality of vertical trenches 702, the top surface of the source-drain active area 408. The bottom opening of each respective vertical trench 702 will be horizontally larger than the top opening thereof. Lastly, with particular reference to FIG. 11, the bottom opening of each respective vertical trench 702 in the plurality of vertical trenches 702 will overlap with the bottom opening of the other vertical trenches 702 in the plurality of vertical trenches 702, in accordance with various embodiments. FIG. 11 shows a top view corresponding to the cross-sectional view of FIG. 8. After the selective wet etching is performed in the two vertical trenches 702, in the present example, the top surface of the source-drain active area 408 and the second sidewall spacer 416 of the second gate stack 406 are exposed in each of the two vertical trenches 702, as shown in FIG. 11.

Figure 9:
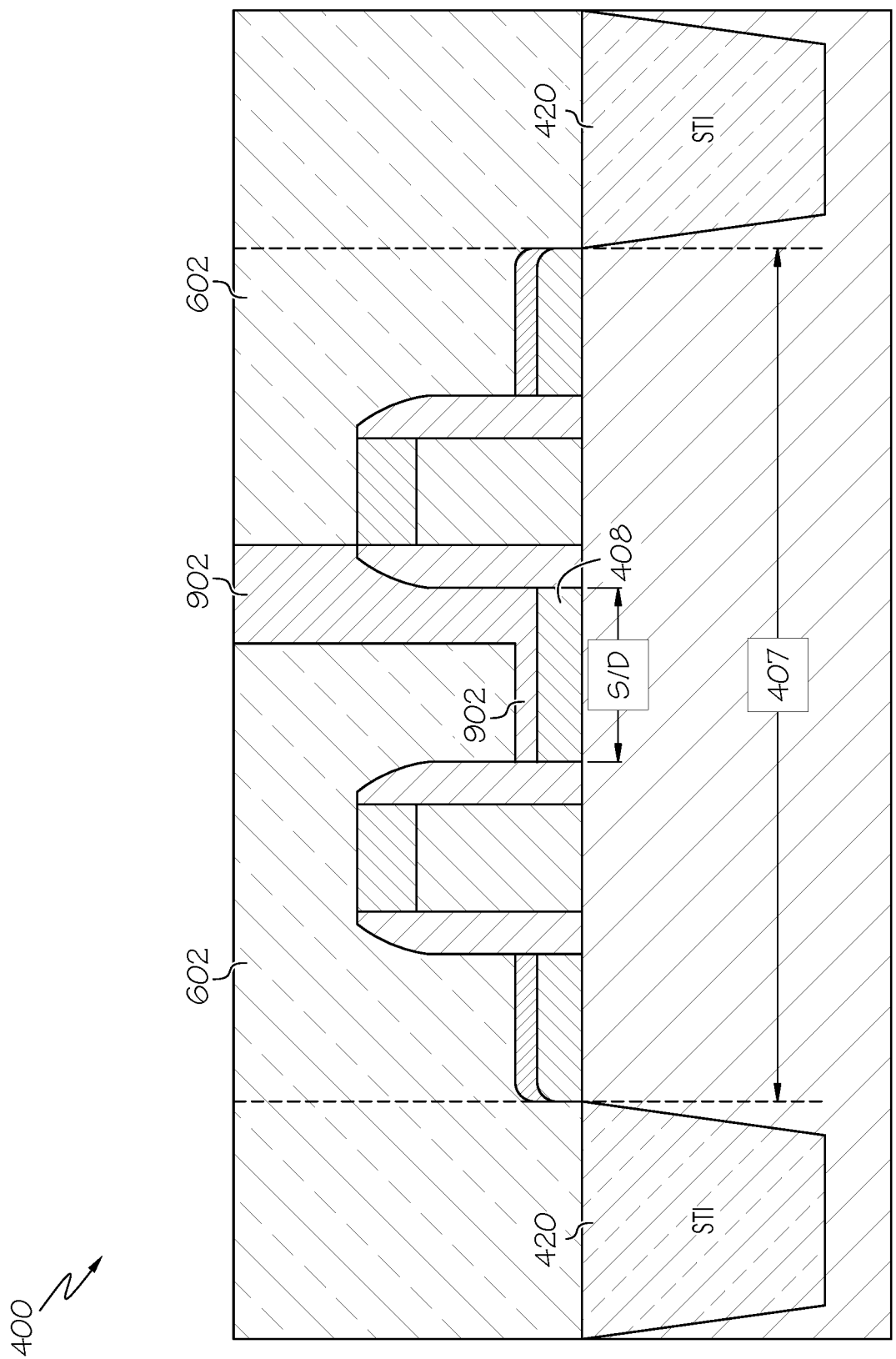
FIG. 9 is a cross-sectional side view of the semiconductor structure of FIG. 8 at a subsequent point in the example fabrication process, following performing deposition of a second conductive material filling the vertical trench from a top opening thereof to a bottom opening thereof.
Figure 12:
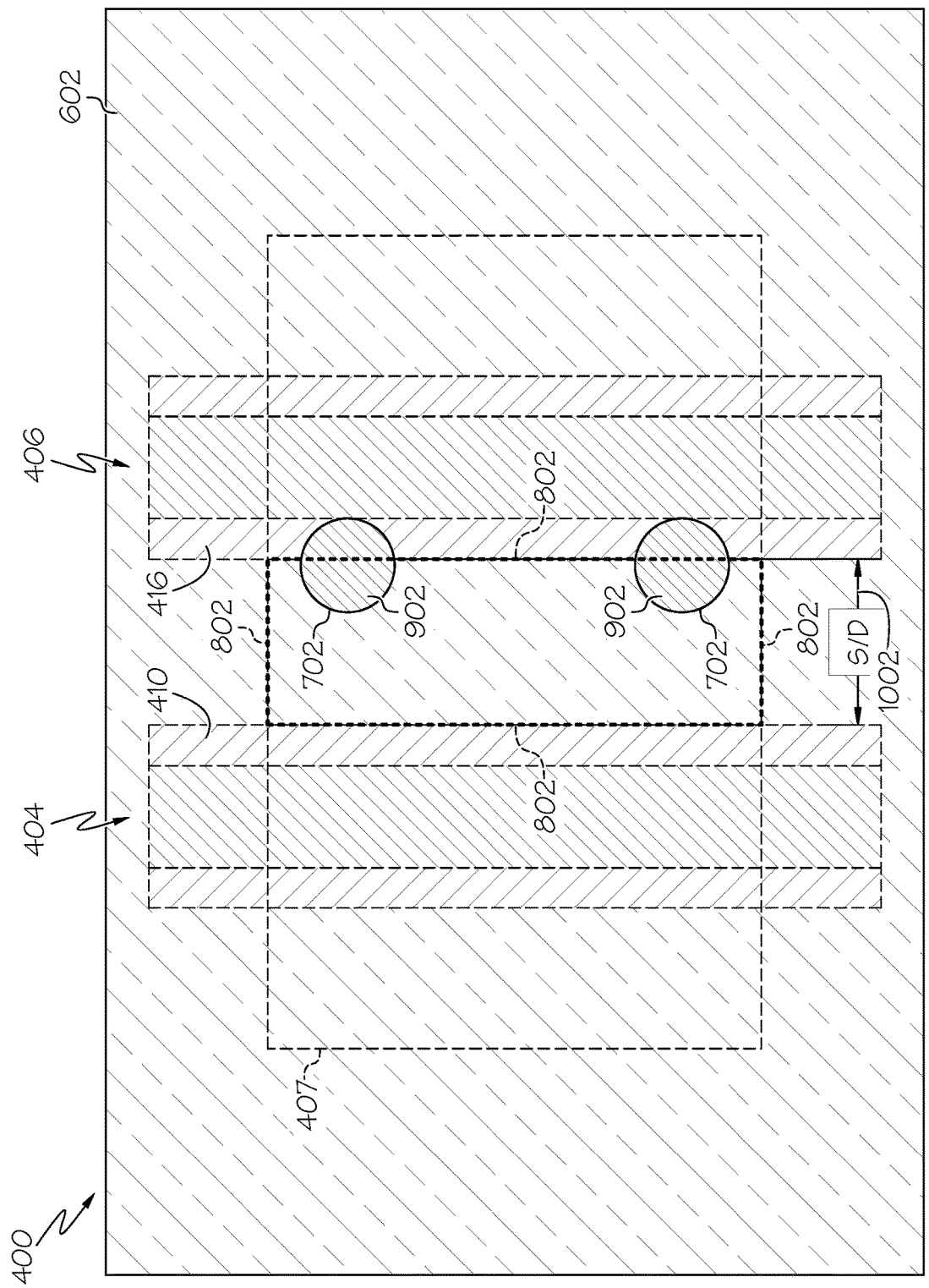
FIG. 12 is a top planar view of the semiconductor structure of FIG. 9.

The semiconductor fabrication process continues, with reference to FIGS. 9 and 12, by performing deposition of a second conductive material 902 into the vertical trench 702 (or into the vertical trenches 702, according to certain embodiments) thereby filling the vertical trench(es) 702 from the top opening thereof to the bottom opening thereof. The second conductive material 902 fills the vertical trench (es) 702 and contacts the top surface of the source-drain active area 408 to form a source-drain self-aligned contact. The second conductive material 902 of the source-drain self-aligned contact will typically be located vertically over, and directly contacting, the top surface of the source-drain active area 408. Optionally according to various embodiments, although not necessarily in all embodiments, the second conductive material 902 of the source-drain self-aligned contact fills the void 802 and directly contacts the top surface of substantially the entire source-drain active area 408, as shown in FIG. 11. The second conductive material 902 of the source-drain self-aligned contact, according to various embodiments, can fill the void 802 and directly contact the top surface of substantially the entire source-drain active area 408, and at least one of the first sidewall spacer 410 or the second sidewall spacer 416, to form the source-drain self-aligned contact, as shown in FIG. 11.

The second conductive material 902 of the source-drain self-aligned contact, according to various embodiments, forms a horizontally rectangular shaped contact of a viabar, or super-viabar, structure at the top opening of the vertical trench 702. The second conductive material 902 of the viabar, or super-viabar, structure extends vertically down from the horizontally rectangular shaped contact, through the ILD layer 602, to the bottom opening of the vertical trench 702. At the bottom opening of the vertical trench 702, the second conductive material 902 contacts the top surface of the source-drain active area 408, or in certain embodiments contacts substantially the entire source-drain active area 408, to form the source-drain self-aligned contact as a viabar or super-viabar structure.

The second conductive material 902, according to various embodiments, fills the vertical trench 702 from the top opening thereof to the bottom opening thereof, and contacts the top surface of the source-drain active area 408 and one of the first sidewall spacer 410 or the second sidewall spacer 416 to form the source-drain self-aligned contact. According to various embodiments, a cross-section of the second conductive material 902 in the vertical trench 702, from the top opening of the vertical trench 702 to the bottom opening thereof, will be formed substantially in an "L" shape.

In various embodiments, the top opening of the vertical trench 702 in the ILD layer 602 above the source-drain active area 408 is located entirely to one side of a vertical axis located at a center region along a horizontal critical dimension measured from an outer wall surface of the first sidewall spacer 410 to an outer wall surface of the second sidewall spacer 416. The vertical trench 702 is filled with the second conductive material 902 fill to form the source-drain self-aligned contact. The second conductive material 902 fill in the vertical trench 702 can have a cross-section, from the top opening of the vertical trench 702 to the bottom opening of the vertical trench 702, that is substantially in an "L" shape.

The second conductive material 902, according to various embodiments, comprises at least one conductive material selected from the following set of conductive materials consisting of: Copper (Cu), Cobalt (Co), Aluminum (Al), Tungsten (W), Titanium (Ti), Tantalum (Ta), Ruthenium (Ru), Hafnium (Hf), Zirconium (Zr), Nickel (Ni), Platinum (Pt), Tin (Sn), Silver (Ag), Gold (Au), a conducting metallic compound material, or a conducting metal alloy including at least one of the preceding conductive materials. While the term "metal contact" may be loosely used in the present discussion while referring to the self-aligned contact, this is a general non-limiting reference to the composition of the conductive material of the self-aligned contact. It is understood that the self-aligned contact is made from the second conductive material 902, which can comprise many different types of conductive materials, such as at least one conductive material selected from the above described set of conductive materials.

It should be noted that the source-drain self-aligned contact, according to the example, will be entirely made of a single conductive material, e.g., the second conductive material 902 as shown in FIGS. 9 and 12. Compare that structure to the structure shown in FIG. 3, in which very differently is shown a prior art source-drain self-aligned contact that typically is made of two separate conductive material layers, e.g., a first conductive material layer 202 directly contacting a top surface of the source-drain active area 108, and a second conductive material layer 302 directly contacting a top surface of the first conductive material layer 202.

In the inventive semiconductor fabrication process and semiconductor structure 400, as shown in FIG. 9, the self-aligned metal contact can make electrical contact with substantially all the top surface of the source-drain active area 408, even while the location and width of the vertical trench 702, and accordingly the location and width of the self-aligned metal contact, can vary between the two gate stacks 404, 406. The design of the self-aligned contact in the semiconductor structure 400, according to various embodiments of the invention, is resistant to pitch variability. At the same time, the design of the self-aligned contact reduces the interface resistance, and enhances the signal performance, of the junction at the self-aligned contact source-drain active area 408. Additionally, the semiconductor process performed to fabricate the semiconductor structure 400 enjoys a reduced number of fabrication process steps and a reduced overall fabrication cost as compared to the prior art fabrication process performed to fabricate the semiconductor structure 100 shown in FIG. 3.

Figure 13:
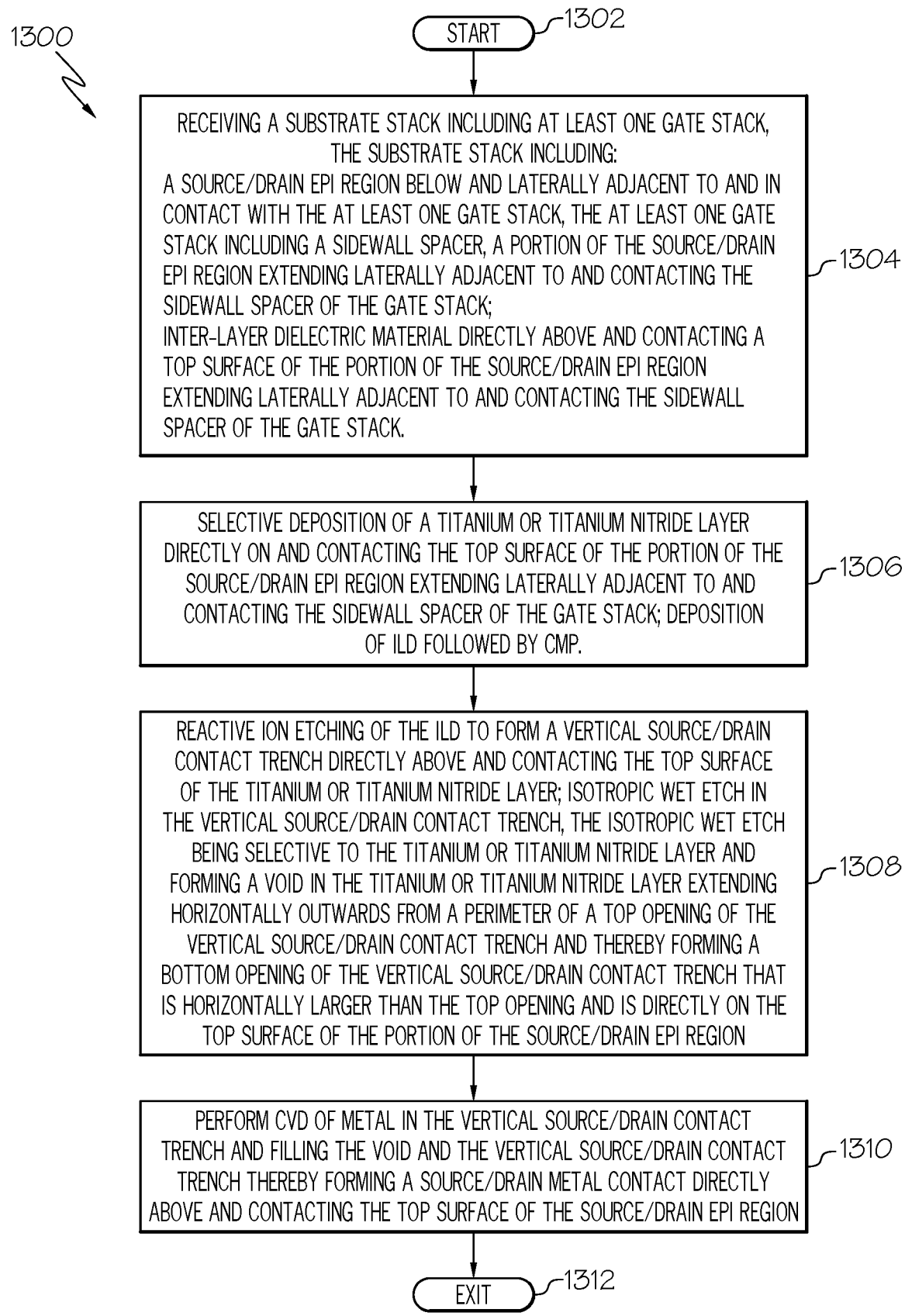
FIG. 13 is an operational flow diagram illustrating an example fabrication process for fabricating a semiconductor structure including a self-aligned contact, according to an embodiment of the present invention.

FIG. 13 illustrates an example method 1300 for fabricating a self-aligned contact for transistor devices on a substrate. Various embodiments of the invention may include some, and not necessarily all, of the method steps in the illustrated example.

The method enters, at step 1302, and immediately proceeds, at step 1304, to receive a substrate stack including at least one gate stack 404, 406. The substrate stack includes a source/drain epi region 408, 409, 411, below and laterally adjacent to and in contact with the at least one gate stack 404, 406. The gate stacks 404, 406, respectively include sidewall spacers 410, 412, 416, 418. A portion of the source/drain epi region 408 extends laterally adjacent to and contacting at least one sidewall spacer 416 of a gate stack 406. Inter-layer dielectric material 602 is located directly above and contacting a top surface of the portion of the source/drain epi region 408 extending laterally adjacent to and contacting the sidewall spacer 416 of the gate stack 406.

The method then proceeds, at step 1306, to perform selective deposition of a Titanium or Titanium nitride layer directly on and contacting the top surface of the portion of the source/drain epi region 408, as has been discussed above with reference to FIG. 5. Deposition of an ILD layer 602, as has been described above with reference to FIG. 6, is followed by chemical mechanical planarization.

The method then, at step 1308, performs vertical directional etching (dry etch) by a Reactive Ion Etching process. The vertical directional etching forms a vertical trench 702 directly above and contacting the top surface of the Titanium or Titanium nitride layer 502, as has been discussed above with reference to FIGS. 7 and 10.

Then, continuing at step 1308, an isotropic wet etch is performed in the vertical trench 702, as has been discussed above with reference to FIGS. 8 and 11. The isotropic wet etch, which is selective to the Titanium or Titanium nitride layer 502, forms a void 802 in the Titanium or Titanium nitride layer 502. The void 802 extends horizontally outside of a top opening of the vertical trench 702 and thereby forms an enlarged bottom opening of the vertical trench 702. The bottom opening is directly on the top surface of the portion of the source/drain epi region (on the top surface of the source-drain active area) 408. The process, at step 1308, has been described in more detail above with reference to FIGS. 8 and 11.

The method, at step 1310, then performs a chemical vapor deposition process of conductive material 902 (e.g., chemical vapor deposition of metal process) in the vertical trench 702, or performs a metal reflow process, and fills the vertical trench 702 including the void 802 with the conductive material 902. The self-aligned source-drain contact is thereby formed directly above and contacting the top surface of the source-drain active area 408. The method then exits, at step 1012.

The self-aligned source-drain metal contact is formed in the vertical trench 702, from a top opening to a bottom opening thereof. The self-aligned metal contact can make electrical contact with substantially all the top surface of the source-drain active area 408, even while the location and width of the vertical trench 702, and accordingly the location and width of the self-aligned metal contact, can vary between the two gate stacks 404, 406. The design of the self-aligned contact is resistant to pitch variability, reduces the interface resistance, and enhances the signal performance, of the junction at the self-aligned contact source-drain active area 408. Additionally, the semiconductor process 1300 performed to fabricate the semiconductor structure 400 benefits from a reduced number of fabrication process steps and a reduced overall fabrication cost.

Although specific embodiments of the invention have been disclosed, those having ordinary skill in the art will understand that changes can be made to the specific embodiments without departing from the scope of the invention. The scope of the invention is not to be restricted, therefore, to the specific embodiments, and it is intended that the appended claims cover any and all such applications, modifications, and embodiments within the scope of the present invention.

It should be noted that some features of the present invention might be used in one embodiment thereof without use of other features of the present invention. As such, the foregoing description should be considered as merely illustrative of the principles, teachings, examples, and exemplary embodiments of the present invention, and not a limitation thereof.

In addition, these embodiments are only examples of the many advantageous uses of the innovative teachings herein. In general, statements made in the specification of the present application do not necessarily limit any of the various claimed inventions. Moreover, some statements may apply to some inventive features but not to others.

What is claimed is:

1. A method for fabricating a semiconductor structure including at least one self-aligned contact, the method comprising:

providing a semiconductor material stack including a plurality of layers, a first gate stack and a second gate stack are directly on a substrate, the first gate stack including a first sidewall spacer and the second gate stack including a second sidewall spacer, a source-drain epi layer is directly on and contacting a top surface of the substrate and horizontally extends to, and contacts, at least one of the first sidewall spacer and the second sidewall spacer, a top surface of the source-drain epi layer providing a source-drain active area of at least one semiconductor device;

forming, by selective deposition of a conductive material including Titanium or Titanium Nitride, a conductive material layer directly on and contacting a top surface of the source-drain active area;

depositing a first dielectric material to form an interlevel dielectric (ILD) layer directly on and contacting a top surface of the conductive material layer, the first sidewall spacer, and the second sidewall spacer;

performing vertical directional etching in the ILD layer to form a vertical trench extending vertically from a top opening thereof to a bottom opening thereof that is contacting the top surface of the conductive material layer on the source-drain active area;

performing selective wet etch in the vertical trench to selectively etch the conductive material of the conductive material layer, the selective wet etch being selective to etch the conductive material of the conductive material layer over the first dielectric material of the ILD layer, the selective wet etch forming a void in the conductive material layer and exposing in the vertical trench a top surface of the source-drain active area, the void extending horizontally outwards and enlarging the bottom opening of the vertical trench horizontally larger than the top opening; and performing deposition of a second conductive material filling the vertical trench from the top opening thereof to the bottom opening thereof and contacting the top surface of the source-drain active area to form a source-drain self-aligned contact.

2. The method of claim 1, wherein the second conductive material comprises at least one conductive material selected from the following set of conductive materials consisting of: Copper (Cu), Cobalt (Co), Aluminum (Al), Tungsten (W), Titanium (Ti), Tantalum (Ta), Ruthenium (Ru), Hafnium (Hf), Zirconium (Zr), Nickel (Ni), Platinum (Pt), Tin (Sn), Silver (Ag), Gold (Au), a conducting metallic compound material, or a conducting metal alloy including at least one of the preceding conductive materials.

3. The method of claim 1, wherein at least one of the first sidewall spacer or the second sidewall spacer includes at least one dielectric material selected from the following set of dielectric materials consisting of:
Silicon Nitride (SiN), Silicon Oxynitride (SiON), Silicon Boron Carbon Nitride (SiBCN), or Silicon Oxygen Carbon Nitride (SiOCN).

4. The method of claim 1, wherein the interlevel dielectric (ILD) layer includes at least one dielectric material selected from the following set of dielectric materials consisting of:
Silicon Oxide (SiO), Silicon Dioxide ($SiO_2$), or Carbon Doped Silicon Oxide (SiCOH).

5. The method of claim 1, wherein the substrate comprises at least one material selected from the following set of materials consisting of:
silicon (Si), silicon germanium (SiGe), silicon carbide (SiC), Si:C (carbon doped silicon), silicon germanium carbide (SiGeC), carbon doped silicon germanium (SiGe:C), III-V compound semiconductor, or II-V compound semiconductor, an organic semiconductor, a layered semiconductor, a silicon-on-insulator, a SiGe-on-insulator, amorphous material, polycrystalline material, monocrystalline material, or a hybrid oriented (HOT) semiconductor material, or a combination of the materials in this set.

6. The method of claim 1, wherein the method includes:
performing the vertical directional etching in the ILD layer to form the vertical trench extending vertically from a top opening thereof to a bottom opening thereof that is contacting:
the top surface of the conductive material layer on the source-drain active area, and
one of the first sidewall spacer or the second sidewall spacer.

7. The method of claim 6, wherein the second conductive material filling the vertical trench from the top opening thereof to the bottom opening thereof, and contacting the top surface of the source-drain active area and contacting one of the first sidewall spacer or the second sidewall spacer to form the source-drain self-aligned contact, has a cross-section from the top opening of the vertical trench to the bottom opening thereof that is substantially in an "L" shape.

8. The method of claim 6, wherein the second conductive material filling the vertical trench from the top opening thereof to the bottom opening thereof contacts the top surface of substantially an entire source-drain active area and contacts the one of the first sidewall spacer or the second sidewall spacer to form the source-drain self-aligned contact.

9. The method of claim 1, wherein the second conductive material filling the vertical trench from the top opening thereof to the bottom opening thereof contacts the top surface of substantially an entire source-drain active area to form the source-drain self-aligned contact.

10. The method of claim 1, wherein the second conductive material is deposited by using a chemical vapor deposition of metal process, or a metal reflow process, or a combination of both processes, followed by chemical and mechanical polishing or an etching step, to fill the vertical trench with the second conductive material from the top opening of the vertical trench to the bottom opening thereof.

11. A semiconductor structure comprising:
a semiconductor material stack including
a plurality of layers,
a first gate stack directly on a substrate, the first gate stack including a first sidewall spacer,
a second gate stack directly on the substrate, the second gate stack including a second sidewall spacer, and
a source-drain epi layer is directly on and contacting a top surface of the substrate and horizontally extends to, and contacts, the first sidewall spacer and the second sidewall spacer, a top surface of the source-drain epi layer providing a source-drain active area of at least one semiconductor device;
an interlevel dielectric (ILD) layer above the first gate stack, the second gate stack, and the source-drain active area; and
a self-aligned contact comprising:
conductive material fill in a vertical trench in the ILD layer and extending from a top opening of the vertical trench to a bottom opening thereof, the bottom opening being horizontally larger than the top opening, and the conductive material fill contacting the top surface of the source-drain active area to form a source-drain self-aligned contact.

12. The semiconductor structure of claim 11, wherein the conductive material fill in the vertical trench extends vertically from a top opening thereof to a bottom opening thereof and contacts:
the top surface of the source-drain active area, and
at least one of the first sidewall spacer or the second sidewall spacer.

13. The semiconductor structure of claim 12, wherein the conductive material fill in the vertical trench from the top opening thereof to the bottom opening thereof contacts the top surface of the source-drain active area and contacts one of the first sidewall spacer or the second sidewall spacer to form the source-drain self-aligned contact, the conductive material fill in the vertical trench having a cross-section from the top opening of the vertical trench to the bottom opening thereof that is substantially in an "L" shape.

14. The semiconductor structure of claim 11, wherein the conductive material fill in the vertical trench forms a viabar, or super-viabar, at the top opening of the vertical trench, extending vertically down through the ILD layer to the bottom opening of the vertical trench, there contacting the top surface of substantially an entire source-drain active area to form the source-drain self-aligned contact.

15. The semiconductor structure of claim 11, wherein the conductive material fill in the vertical trench from the top opening thereof to the bottom opening thereof contacts the top surface of substantially an entire source-drain active area and contacts at least one of the first sidewall spacer and the second sidewall spacer to form the source-drain self-aligned contact.

16. The semiconductor structure of claim 11, wherein the substrate comprises at least one material selected from the following set of materials consisting of:
silicon (Si), silicon germanium (SiGe), silicon carbide (SiC), Si:C (carbon doped silicon), silicon germanium carbide (SiGeC), carbon doped silicon germanium (SiGe:C), III-V compound semiconductor, or II-V compound semiconductor, an organic semiconductor, a layered semiconductor, a silicon-on-insulator, a SiGe-on-insulator, amorphous material, polycrystalline material, monocrystalline material, or a hybrid oriented (HOT) semiconductor material, or a combination of the materials in this set.

17. The semiconductor structure of claim 11, wherein the interlevel dielectric (ILD) layer includes at least one dielectric material selected from the following set of dielectric materials consisting of:
Silicon Oxide (SiO), Silicon Dioxide (SiO$_2$), or Carbon Doped Silicon Oxide (SiCOH).

18. The semiconductor structure of claim 11, wherein at least one of the first sidewall spacer or the second sidewall spacer includes at least one dielectric material selected from the following set of dielectric materials consisting of:
Silicon Nitride (SiN), Silicon Oxynitride (SiON), Silicon Boron Carbon Nitride (SiBCN), or Silicon Oxygen Carbon Nitride (SiOCN).

19. The semiconductor structure of claim 11, wherein the conductive material fill comprises at least one conductive material selected from the following set of conductive materials consisting of: Copper (Cu), Cobalt (Co), Aluminum (Al), Tungsten (W), Titanium (Ti), Tantalum (Ta), Ruthenium (Ru), Hafnium (Hf), Zirconium (Zr), Nickel (Ni), Platinum (Pt), Tin (Sn), Silver (Ag), Gold (Au), a conducting metallic compound material, a conducting metal alloy including at least one of the preceding conductive materials.

20. The semiconductor structure of claim 11, wherein the top opening of the vertical trench in the ILD layer above the source-drain active area is located entirely to one side of a vertical axis located at a center region along a horizontal critical dimension measured from an outer wall surface of the first sidewall spacer to an outer wall surface of the second sidewall spacer, the vertical trench being filled with the conductive material fill to form the source-drain self-aligned contact.

* * * * *